(12) United States Patent
Gilet

(10) Patent No.: US 7,246,026 B2
(45) Date of Patent: Jul. 17, 2007

(54) MULTI-DOMAIN EXECUTION OF TESTS ON ELECTRONIC DEVICES

(75) Inventor: Lionel Gilet, Austin, TX (US)

(73) Assignee: Credence Systems Corporation, Milpitas, CA (US)

( * ) Notice: Subject to any disclaimer, the term of this patent is extended or adjusted under 35 U.S.C. 154(b) by 0 days.

(21) Appl. No.: 11/022,148

(22) Filed: Dec. 21, 2004

(65) Prior Publication Data

US 2006/0136164 A1   Jun. 22, 2006

(51) Int. Cl.
*G01R 31/00* (2006.01)
*G01R 31/14* (2006.01)

(52) U.S. Cl. .................................... 702/119

(58) Field of Classification Search ........ 702/117–121, 702/122–123; 703/3, 4, 13–16, 19; 714/25, 714/28, 30, 724, 738, 741; 716/4, 6
See application file for complete search history.

(56) References Cited

U.S. PATENT DOCUMENTS

| | | | |
|---|---|---|---|
| 6,879,927 B1 * | 4/2005 | Lu | 702/123 |
| 7,099,792 B2 * | 8/2006 | Giral et al. | 702/123 |
| 7,107,173 B2 * | 9/2006 | Fritzsche | 702/122 |
| 7,107,574 B1 * | 9/2006 | Nedbal | 717/120 |
| 7,127,641 B1 * | 10/2006 | Anderson | 714/38 |
| 2003/0105607 A1 | 6/2003 | Jones et al. | 702/121 |

OTHER PUBLICATIONS

U.S. Appl. No. 11/520,202, Gilet, "Multi-Domain Execution of Tests on Electronic Devices", Sep. 12, 2006.*

* cited by examiner

*Primary Examiner*—Michael Nghiem

(57) ABSTRACT

A device under test is divided into multiple test domains, and test conditions for each of the multiple test domains are defined separately, so that each test domain has its own test pattern, timing data, and other test conditions. Each test domain can start and stop independently, and run at different speeds. Further, triggers are used to specify how the tests executed in the different test domains interact and communicate with one another. Any test domain can generate or wait for a trigger from any other test domain (including the CPU).

22 Claims, 9 Drawing Sheets

```
public void executeTest(TestStatusList testStatusList) throws java.lang.Exeception
{
    exec.establish (testContext, Equations);
    eqnsContext = testContext.getObject("EquationContext");
    SignalGroups.setup(testContext);
    Triggers.setup(testContext);  ← Step 211
    // Setup Multi-Domain Execution and sub sections
    MultiDomainExecution.setup(testContext);  ← Step 212
    executePattern(testStatusList);  ← Step 213
    updateTestStatus(testStatusList);
} protected void executePattern(TestStatusList testStatusList) throws java.lang.Exeception
{
    double settingTime = SettingTime.getValue(eqnsContex, 0, 0);
    double seconds = TimeOut.getValue(eqnsContext, -1, -1);
    CapArea execRegionIter = exec.getArea("Iterator");

while ((execRegionIter != null) && execRegionIter.hasNext())
    {
    execRegion = execRegionIter.next();
    execRegion.invoke("Setup");

do {
            exec.invoke("Setup");
            prePatternStart();
            exec.setD("AddDelay", setting Time);
            // Generate start sync
            Triggers.start();  ← Step 214
            if ( Triggers.whilePatternRuns(seconds) ==false ) {
                handleTimeout();
            }
            postPatternCompletion();
        }
       while (exec.getB("ReExecute"));

postPatternExec();
    }
    exec,unvije("Release");
}
```

FIGURE 5

```
Public class MyTriggersBlock extends TriggersBlock
{
        public void start() throws java.lang.Exception
        {
                generateSync("StartDigital");  ← Step 211
        }

//This method is called automatically when a sync has been received.
        Public boolean handleSync(CapArea sync) throws java.lang.Exception
        {
                String syncName = sync.getS("Name");

if ( syncName.equals("EndOfTest") )
                        return true; // indicate the test is finished // here we can handle ay Sync we want the way we want.
                If ( syncName.equals("CaptureDone") )
                        dowloadCapture();

return false; // the sync did not indicate that the test was finished
        }
}
```

FIGURE 6

```xml
<Triggers name="Triggers_Digital_Analog">
    <Class>DigitalAnalogTriggers</Class>
    <Trigger name="StartDigital">
        <Generators>
            <CPU></CPU>
        </Generators>
        <Actors>
            <Actor SignalRef="allPinsDigital">
                <HardwareEvent>START</HardwareEvent>
            </Actor>
        </Actors>
    </Trigger>                                              } 221
    <Trigger name="StartAnalog">
        <Generators>
            <Generator SignalRef="allPinsDigital"></Generator>
        <Generators>
        <Actors>
            <Actor SignalRef="AllPinsAnalog">
                <HardwareEvent>START</HardwareEvent>
            </Actor>
        </Actors>
    </Trigger>                                              } 222
    <Trigger name="CaptureDone">
        <Generators>
            <Generator SignalRef="MeasSignalsMux0">
                <HardwareEvent>CAPTURE_DONE</HardwareEvent>
            </Generator>
        </Generators>
        <Actors>
            <CPU></CPU>
        </Actors>
    </Trigger>                                              } 223
    <Trigger name="EndOfTest">
        <Generators>
            <Generator SignalRef="allPinsDigital">
                <HardwareEvent>STOP</HardwareEvent>
            </Generator>
        </Generators>
        <Actors>
            <CPU></CPU>
        </Actors>
    </Trigger>                                              } 224
</Triggers>
```

FIGURE 7

```xml
<MultiDomainExecution name="Mtest_Digital_Analog">
    <DomainExecution>
        <SigRef>allPinsDigital</SigRef>
        <BlockRef type="PatternBurst">
            <Name>DigitalPattern</Name>
        </BlockRef>
        <BlockRef type="Timing">
            <Name>DigitalTiming</Name>
        </BlockRef>
    </DomainExecution>                                  } 231
    <DomainExecution>
        <SigRef>SrcSignalsMux0</SigRef>
        <BlockRef type="PatternBurst">
            <Name>AnalogSourcePattern</Name>
        </BlockRef>
        <BlockRef type="Timing">
            <Name>AnalogSourceTiming</Name>
        </BlockRef>
        <BlockRef type="AnalogSource">
            <Name>AnalogSourceDef</Name>
        </BlockRef>
        <BlockRef type="AnalogSetup">
            <Name>AnalogSourceSetup</Name>
        </BlockRef>
    </DomainExecution>                                  } 232
    <DomainExecution>
        <SigRef>MeasSignalsMux0</SigRef>
        <BlockRef type="PatternBurst">
            <Name>AnalogAcquirePattern</Name>
        </BlockRef>
        <BlockRef type="Timing">
            <Name>AnalogAcquireTiming</Name>
        </BlockRef>
        <BlockRef type="AnalogAcquire">
            <Name>AnalogAcquireDef</Name>
        </BlockRef>
        <BlockRef type="AnalogSetup">
            <Name>AnalogAcquireSetup</Name>
        </BlockRef>
    </DomainExecution>                                  } 233
</MultiDomainExecution>
```

FIGURE 8

MULTI-DOMAIN EXECUTION OF TESTS ON ELECTRONIC DEVICES

BACKGROUND OF THE INVENTION

1. Field of the Invention

The present invention relates generally to electronic device testing, and more particularly, to multi-domain execution of tests on electronic devices.

2. Description of the Related Art

A test system having a multiple instrument platform represents a significant advance in the art. One example of such a test system is described in U.S. patent application Ser. No. 10/222,191, entitled "Circuit Testing with Ring-Connected Test Instrument Modules," filed Aug. 16, 2002, the entire contents of which are incorporated by reference herein.

In this test system 100, illustrated in FIG. 1, a test head interface module 110 and a plurality of instruments (collectively referred to as 120; individually referred to as instrument A, instrument B, and instrument C) are connected together over a ring bus 130. The test head interface module 110 houses a global clock 140 to which all of the instruments 120 are synchronized.

During testing, the test system 100 operates under the control of software, e.g., a test program. The test program specifies the test conditions, including the test data to be supplied to a device under test (DUT) 150, the expect data to be compared with the response signals from the DUT 150, and timing information indicating when the test data are to be supplied and when the response signals are to be strobed.

With a multiple instrument platform, the designer of a test has the flexibility to simultaneously test different pins of the DUT 150 with different test data and to condition the triggering of this test with respect to certain programmed events or certain events detected at the DUT 150. In addition, the test system having a multiple instrument platform is able to accommodate testing of pins at different clock rates. For example, if the core part of the DUT 150 operates at 250 MHz and other parts of the DUT 150 operates at 100 MHz, the pins corresponding to the core part are tested with instruments running at 250 MHz and the pins corresponding to the other parts are tested with instruments running at 100 MHz.

SUMMARY OF THE INVENTION

The present invention provides methods for defining and carrying out multi-domain tests on electronic devices. According to an embodiment of the present invention, the electronic device is divided into multiple test domains, and test conditions for each of the multiple test domains are defined separately, so that each test domain has its own test pattern, timing data, and other test conditions. Triggers are used to specify how tests executed in the different test domains interact and communicate with one another. For example, the initiation of a test in one test domain may be conditioned on a certain event detected in another test domain.

The multi-domain execution ("MDE") methods according to the invention provide several advantages over the prior art. First, it provides test design flexibility. In the prior art, all parts of the electronic device being tested are required to start at the same time and share more or less common test conditions. Test patterns and timing conditions are defined for the whole device, and a master test domain is often used to control other test domains. In the invention, the multiple test domains can start independently, run at different speeds and stop independently. Each test domain has its own set of test conditions to make this possible. Further, any test domain can generate or wait for a trigger from any other test domain (including the CPU), so there is no master test domain. Second, the task of defining the test conditions for the entire test is broken up into manageable pieces. Instead of having to define test conditions for one big test, the test designer is now permitted to define test conditions for one test domain at a time. Third, the task of managing test program development is much easier, because the test program development can be split up by test domain and test conditions defined for one test domain may be reused in other test domains.

The present invention further provides a computer-readable medium having program instructions to be executed on a test apparatus that implement MDE. In one embodiment, the program instructions comprise XML blocks, which during execution are passed as software objects. An XML block is defined for each test domain and specifies the test pattern, timing data, and other test conditions for that test domain. An XML block is also defined for each of the triggers and defines the trigger generator (the test component that generates the trigger) and the trigger actor (the test component that acts on the trigger).

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 5 is a simplified test script that implements multi-domain testing;

FIG. 6 is a portion of the test script that defines an object class used in multi-domain testing;

FIG. 7 is a simplified triggers data block used in multi-domain testing;

FIG. 8 is a simplified multi-domain execution data block used in multi-domain testing.

DETAILED DESCRIPTION

Figure 1:
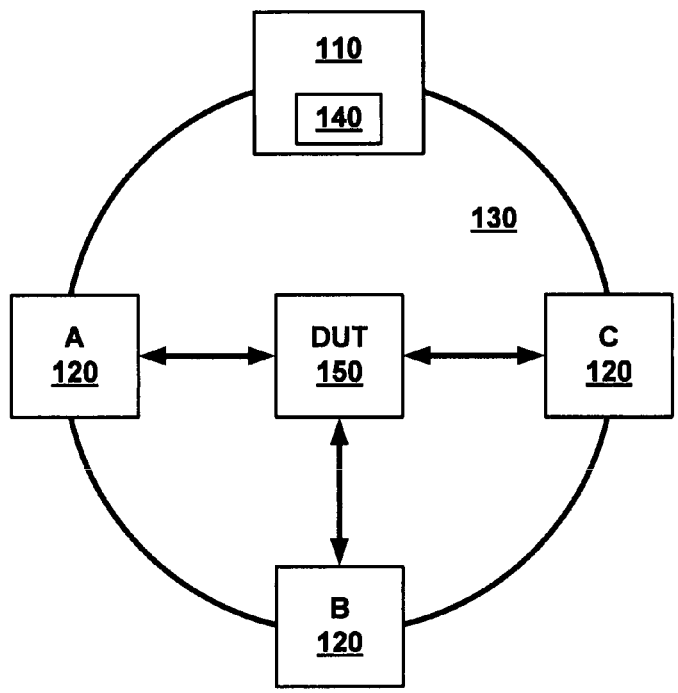
FIG. 1 is a block diagram of a test system having test instruments connected in a ring configuration.
Figure 2:
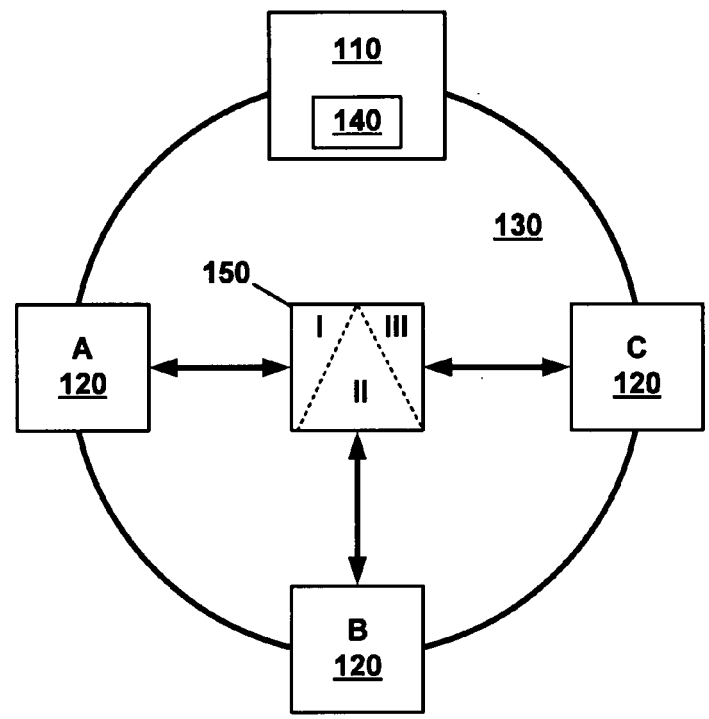
FIG. 2 is a block diagram of a test system having test instruments connected in a ring configuration and a DUT divided into multiple test domains.

FIG. 2 is a block diagram of the test system 100 showing an illustrative environment in which the methods according to the invention can be applied. The DUT 150 in this example is a mixed signal device comprising a digital section and an analog section. The digital section includes the CPU core, the I/O bus, and other digital components of the DUT 150 and the analog section includes the video processing section and the audio processing section.

FIG. 2 also shows the functional division of the DUT 150 into multiple test domains. Test domain I comprises the digital section of the DUT 150 and instrument A that is connected to the pins of the digital section. Test domain II comprises the video processing section of the DUT 150 and instrument B that is connected to the pins of the video processing section. Test domain III comprises the audio processing section of the DUT 150 and instrument C that is connected to the pins of the audio processing section. Each of these test domains has its own test pattern, timing data, and other test conditions defined for it in the test program.

The tests that are carried out in the different test domains interact and communicate with each other through triggers that can be generated during execution of tests in any of the test domains. For example, instrument A can generate a trigger during a test executed in test domain I to instruct the initiation of a test in test domain II, and instrument B can generate a trigger during a test executed in test domain II to instruct the initiation of a test in test domain III. In general, any test domain can generate a trigger and carry out programmed instructions in response to a trigger. The trigger can initiate any type of action in a test domain, including initiation of a test, termination of a test, and exiting a loop defined in a test.

Figure 3:
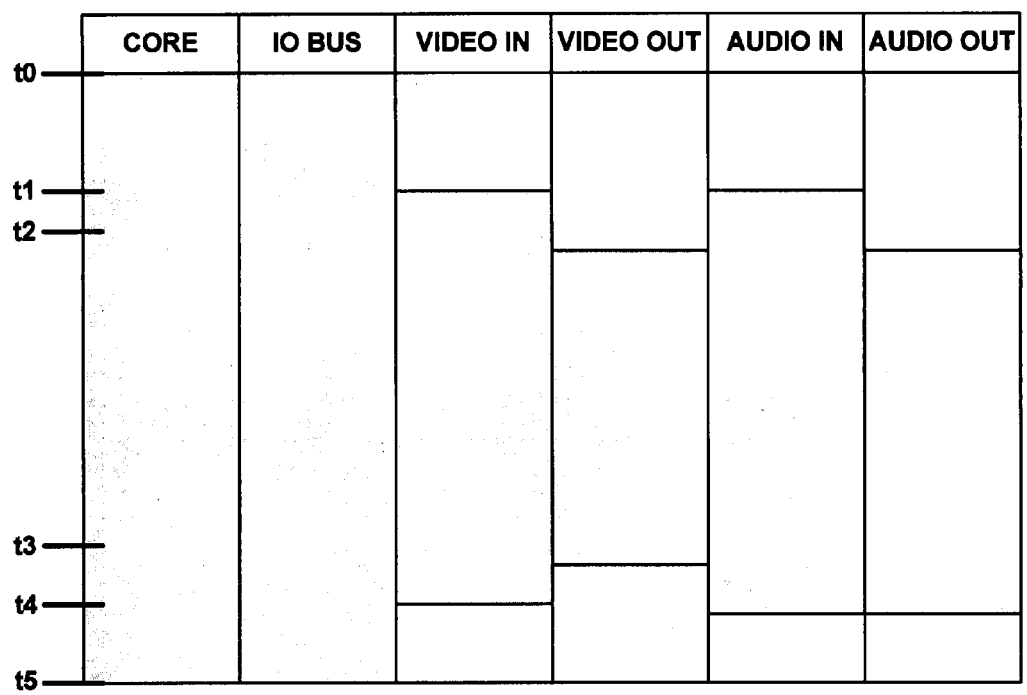
FIG. 3 illustrates graphically the timing of tests carried out in multiple test domains.

FIG. 3 illustrates graphically the timing of tests carried out in different domains in a situation where the multi-domain testing according to the invention is applied to six different test domains: Core, IO Bus, Video In, Video Out, Audio In, and Audio Out. At time t=t0, the tests in the test domains for Core and IO Bus are initiated. During the test in the Core test domain, a trigger is issued for tests to be initiated in the test domains for Video In and Audio In at t=t1. At t=t1, the tests in the test domains for Video In and Audio In are initiated. During the test in the Video In test domain, a trigger is issued for the test to be initiated in the Video Out test domain at t=t2. At t=t2, the tests in the Video Out test domain is initiated. During the test in the Audio In test domain, a trigger is issued for the test to be initiated in the Audio Out test domain at t=t2. At t=t2, the test in the Audio Out test domain is initiated.

The termination of the tests in the different test domains may be programmed to occur at different times. In the example shown in FIG. 3, the termination of the test in the Video Out test domain occurs at t=t3, and the termination of the tests in the test domains for Video In, Audio In, and Audio Out occurs at t=t4. The termination of the tests in the test domains for Core and IO Bus occurs at t=t5.

Also, the termination of a test may be conditioned upon an event occurring in another test domain. In the example shown in FIG. 3, the test in the Video In test domain is programmed to terminate upon receipt of a trigger that is generated when the test in the Video Out test domain terminates. Such a trigger is issued at t=t3 in the Video Out test domain and received at t=t4 in the Video In test domain. Upon receipt of this trigger, the test in the Video In test domain is terminated.

The speed at which each of the tests in the different test domains is carried out may be different because these are independent test domains, such that test speed variation is permitted and may be designed into the test program. Thus, if the Core test domain runs at 250 MHz and the I/O Bus test domain runs at 100 MHz, both of these test domains may be tested by specifying timing data corresponding to 250 MHz for the Core test domain and specifying timing data corresponding to 100 MHz for the I/O Bus test domain.

Accordingly, the digital test setup is independent from the analog test setup. Further, different analog signals (video, audio, RF, etc.) can have independent test domains with independent test conditions. Triggers allow the test designer the flexibility to coordinate the start and stop conditions and to send messages across different test domains.

Figure 4:
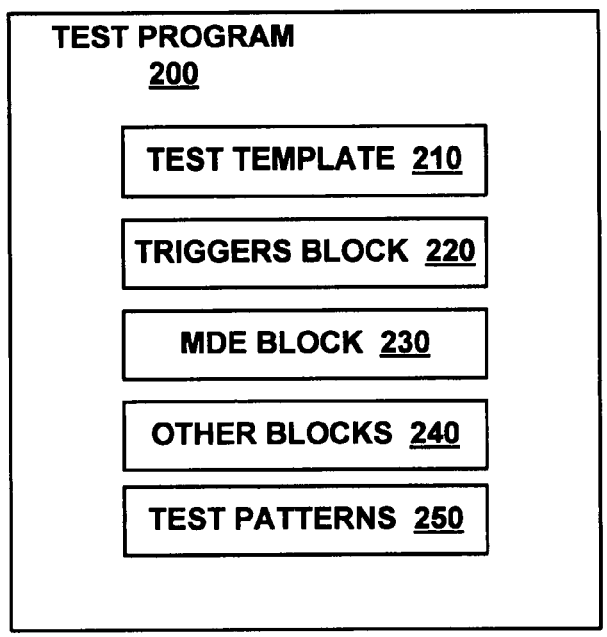
FIG. 4 shows different components of a test program that implements multi-domain testing.

The components of a test program 200 that implement multi-domain testing is shown schematically in FIG. 4. It includes a test script 210, commonly referred to as a test template, a triggers data block 220, an MDE data block 230, various other data blocks 240, and test patterns 250. In the embodiment of the invention described herein, the programming language for the test script 210 is Java® and the test script 210 belongs to a Java® class named TestTemplate. Also, the data blocks 220, 230, 240 are XML data blocks that are passed as Java® objects during run-time.

FIG. 5 is a simplified version of the test script 210 and shows the executeTest( ) method of the TestTemplate Java® class that executes a test whose parameters are generally defined in the "testContext" parameter, and the executePattern( ) method that executes a test pattern. In Step 211, the instruments that will generate and wait for triggers are programmed using Java® objects which were previously converted from the triggers data block 220. In Step 212, the instruments are programmed according to the test conditions specified in the test domain they are associated with using software Java® objects which were previously converted from the MDE data block 230. The executePattern( ) method is called in Step 213.

The executePattern( ) method begins the execution of the test pattern by calling the start( ) method of the Triggers object in Step 214. The Triggers object belongs to a Java class that is defined as shown in FIG. 6. One of the methods defined in the Java class of FIG. 6 is the start( ) method. In Step 215, the start( ) method invokes another method, generateSync("StartDigital"), which causes a trigger identified as "StartDigital" to be generated.

FIG. 7 is a simplified version of a triggers data block 220. This data block is stored in XML format and defines four different triggers. The "StartDigital" trigger is defined in section 221. The "StartAnalog" trigger is defined in section 222. The "CaptureDone" trigger is defined in section 223. The "EndOfTest" trigger is defined in section 224. Each trigger definition specifies how the trigger is generated (between the <Generators> and </Generators> tags) and how the trigger is acted upon (between the <Actors> and </Actors> tags). The "StartDigital" trigger, for example, is defined to be generated by the CPU and, in response to this trigger, a hardware event is generated within the instrument such that it starts executing a predefined pattern. The reaction of the instrument to a trigger is programmed in Step 211 of FIG. 5.

FIG. 8 is a simplified version of an MDE data block 230. This data block is stored in XML format and specifies the name and the test conditions of three test domains. The first test domain 231 is defined with the name "allPinsDigital." Its test pattern is specified as "DigitalPattern" and its timing data is specified as "DigitalTiming." The second test domain 232 is defined with the name "SrcSignalsMux0." Its test pattern is specified as "AnalogSourcePattern" and its timing data is specified as "AnalogSourceTIming." The second test domain 232 has two other test conditions identified. They are "AnalogSourceDef" which defines the source analog waveform and "AnalogSourceSetup" which specifies setup parameters for the source analog signal. The third test domain 233 is defined with the name "MeasSignalsMux0." Its test pattern is specified as "AnalogAcquirePattern" and its timing data is specified as "AnalogAcquireTIming." The third test domain 233 has two other test conditions identified. They are "AnalogAcquireDef" which defines the measuring analog conditions and "AnalogAcquireSetup" which specifies setup parameters for the measuring analog signal.

Figure 9:
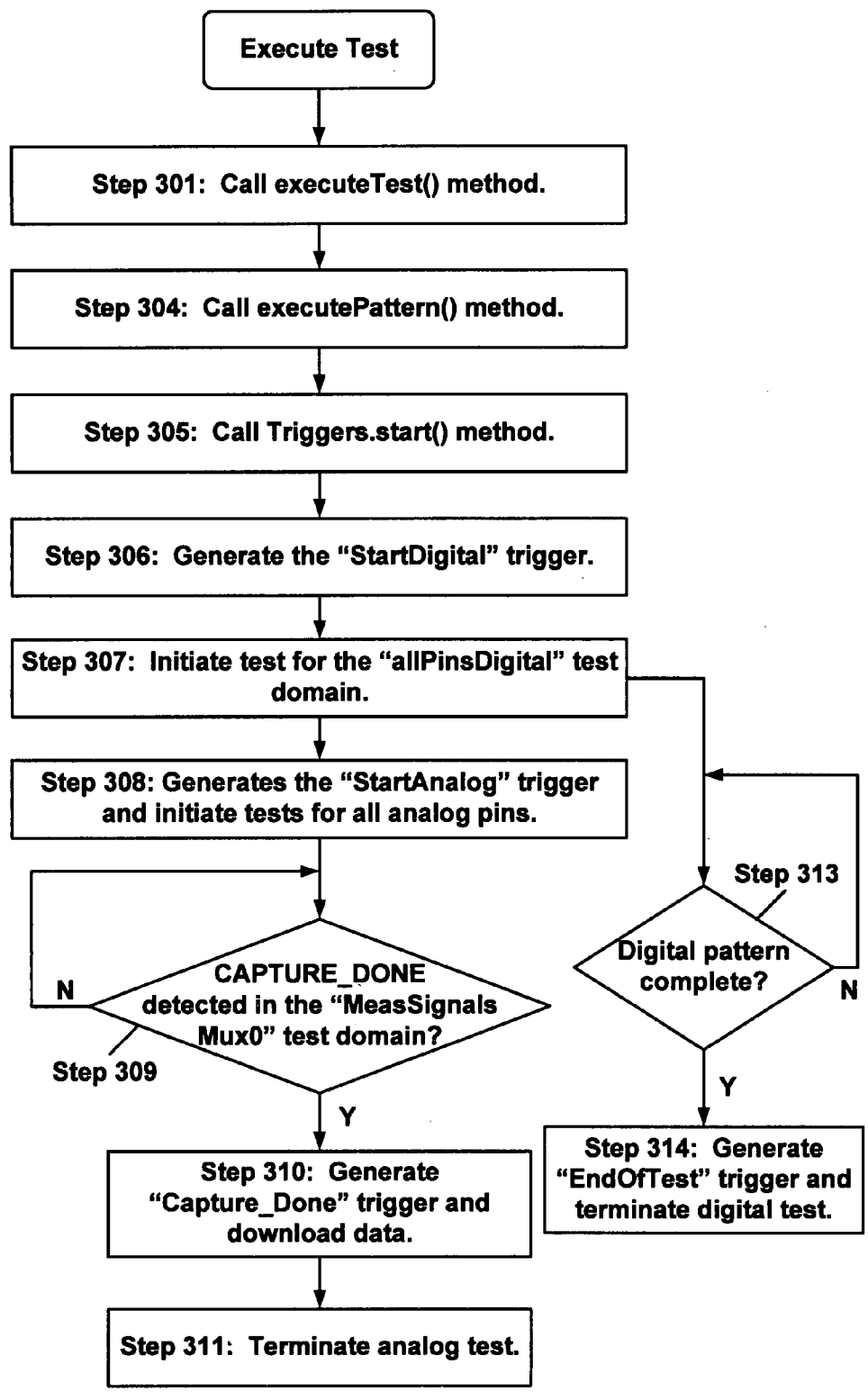
FIG. 9 is a flow diagram illustrating the execution steps of a sample multi-domain test.

FIG. 9 is a flow diagram illustrating the test execution steps of a test script shown in FIG. 5, which uses: (i) the triggers Java® class defined according to FIG. 6, and (ii) Java® objects that are translated from the triggers data block defined according to FIG. 7 and the MDE data block defined according to FIG. 8 and passed as parameters to the TestTemplate Java® class. In Step 301, the executeTest( ) method of the TestTemplate Java® class is initiated, and the executePattern( ) method is called (Step 304). Then, in Step 305, the executePattern( ) method begins the test for a test domain using the start( ) method of the Triggers object. The start( ) method of the Triggers object invokes the method, generateSync("StartDigital"), which causes a trigger identified as "StartDigital" to be generated (Step 306).

FIG. 7 shows that the "StartDigital" trigger is generated by the CPU and initiates the test defined in the "allPinsDigital" test domain (Step 307). FIG. 8 shows that the test pattern corresponding to the "allPinsDigital" test domain is specified as "DigitalPattern." This test pattern generates the "StartAnalog" trigger and initiates the tests for all analog pins (Step 308). The tests for all analog pins correspond to the tests defined in the "SrcSignalsMux0" test domain and the "MeasSignalsMux0" test domain.

The "CaptureDone" trigger is generated by the "MeasSignalsMux0" test domain when the "CAPTURE_DONE" event is detected during the test (Step 309), i.e., when the signal has captured a predefined number of samples. In response to this trigger, the CPU begins downloading captured data and then terminates the analog test (Steps 310 and 311). The "EndOfTest" trigger is generated by the "allPinsDigital" test domain when completion of the digital pattern is detected during the test (Step 313). In response to this trigger, the CPU terminates the digital test (Step 314).

While the foregoing is directed to embodiments of the present invention, other and further embodiments of the invention may be devised without departing from the basic scope thereof, and the scope thereof is determined by the claims that follow.

What is claimed is:

1. A method of testing an electronic device, comprising:
   (a) designating multiple test domains for the electronic device;
   (b) defining a test for each of the multiple test domains separately, each such definition specifying a test pattern and timing data to be used with the test;
   (c) defining triggers for initiating each test defined in (b);
   (d) executing the tests and triggers defined in (b) and (c); wherein the test and the triggers are defined as extensible markup language (XML) blocks and passed as objects during (d); and
   (e) storing test and trigger results operable for access by a user.

2. The method according to claim 1, wherein the tests defined for at least two of the test domains specify tests carried out at different speeds.

3. The method according to claim 1, wherein the electronic device is a mixed signal device and one of the test domains is an analog test domain and another of the test domains is a digital test domain.

4. The method according to claim 3, wherein said tests defined for at least two of the test domains specify tests carried out at different speeds.

5. A computer-readable medium having stored therein program instructions to execute a method for testing an electronic device comprising:
   (a) initiating a test for a first test region of the electronic device at a first test instrument of said apparatus;
   (b) generating a trigger at the first test instrument in response to an event associated with the first test region of the electronic device;
   (c) initiating a test for a second test region of the electronic device at a second test instrument of said apparatus in response to a receipt of the trigger at the second test instrument,
   wherein the program instructions comprise extensible markup language (XML) blocks, each of the XML blocks corresponding to a test for one test region and specifying a test pattern and timing data to be used with the test for said test region; and
   (d) storing test and trigger results operable for access by a user.

6. The computer-readable medium according to claim 5, wherein the program instructions define the test from the first test region separately for the test for the second test region, each such test definition specifying a test pattern and timing data to be used with the test.

7. The computer-readable medium according to claim 5, wherein the program instructions further comprise XML blocks that define triggers.

8. The computer-readable medium according to claim 5, wherein said initiating comprises executing a test pattern to generate test signals to be supplied to the first region of the electronic device.

9. A computer-readable medium according to claim 8, wherein the event associated with the first test region comprises a programmed event in the test pattern.

10. A computer-readable medium according to claim 8, wherein the event associated with the first test region comprises an event detected in outputs of the first test region of the electronic device generated in response to the test signals supplied to the first test region of the electronic device.

11. The computer-readable medium according to claim 5, wherein the test for the first test region is carried out at a first clock speed and the test for the second test region is carried out at a second clock speed that is different from the first clock speed.

12. A computer-readable medium having stored therein program instructions to be executed in an apparatus for testing an electronic device, said method comprising:
   (a) designating multiple test domains for the electronic device;
   (b) defining a test for each of the multiple test domains separately, each such definition specifying a test pattern and timing data to be used with the test;
   (c) defining triggers for initiating each test defined in (b);
   (d) executing the tests and triggers defined in (b) and (c), wherein the test and the triggers are defined as extensible markup language (XML) blocks and passed as objects during (d); and
   (e) storing test and trigger results operable for access by a user.

13. The computer-readable medium as described in claim 12, wherein the tests defined for at least two of the test domains specify tests carried out at different speeds.

14. The computer-readable medium as described in claim 12, wherein the electronic device is a mixed signal device and one of the test domains is an analog test domain and another of the test domains is a digital test domain.

15. The computer-readable medium as described in claim 14, wherein said tests defined for at least two of the test domains specify tests carried out at different speeds.

16. A method for testing an electronic device, wherein said method comprising:
(a) initiating a test for a first test region of the electronic device at a first test instrument of said apparatus;
(b) generating a trigger at the first test instrument in response to an event associated with the first test region of the electronic device;
(c) initiating a test for a second test region of the electronic device at a second test instrument of said apparatus in response to a receipt of the trigger at the second test instrument,
wherein the program instructions comprise extensible markup language (XML) blocks, each of the XML blocks corresponding to a test for one test region and specifying a test pattern and timing data to be used with the test for said test region; and
(d) storing test and trigger results operable for access by a user.

17. The method as described in claim 16, wherein the program instructions define the test from the first test region separately for the test for the second test region, each such test definition specifying a test pattern and timing data to be used with the test.

18. The method as described in claim 16, wherein the program instructions further comprise XML blocks that define triggers.

19. The method as described in claim 16, wherein said initiating comprises executing a test pattern to generate test signals to be supplied to the first region of the electronic device.

20. The method as described in claim 19, wherein the event associated with the first test region comprises a programmed event in the test pattern.

21. The method as described in claim 19, wherein the event associated with the first test region comprises an event detected in outputs of the first test region of the electronic device generated in response to the test signals supplied to the first test region of the electronic device.

22. The method as described in claim 16, wherein the test for the first test region is carried out at a first clock speed and the test for the second test region is carried out at a second clock speed that is different from the first clock speed.

* * * * *